United States Patent
Tanaka et al.

(10) Patent No.: US 9,106,156 B2
(45) Date of Patent: Aug. 11, 2015

(54) POWER SEMICONDUCTOR DEVICE

(71) Applicants: Tomofumi Tanaka, Tokyo (JP); Toru Iwagami, Tokyo (JP)

(72) Inventors: Tomofumi Tanaka, Tokyo (JP); Toru Iwagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 335 days.

(21) Appl. No.: 13/677,028

(22) Filed: Nov. 14, 2012

(65) Prior Publication Data

US 2013/0155745 A1 Jun. 20, 2013

(30) Foreign Application Priority Data

Dec. 14, 2011 (JP) ................................. 2011-272961

(51) Int. Cl.
*H02M 1/088* (2006.01)
*H02M 7/537* (2006.01)
*H02M 7/00* (2006.01)

(52) U.S. Cl.
CPC .............. *H02M 7/537* (2013.01); *H02M 7/003* (2013.01); *H01L 2224/48137* (2013.01); *H01L 2224/48247* (2013.01); *H01L 2224/49113* (2013.01); *H01L 2924/1305* (2013.01); *H01L 2924/13055* (2013.01); *H01L 2924/13091* (2013.01); *H01L 2924/30107* (2013.01)

(58) Field of Classification Search
USPC .................................................. 363/132, 147
See application file for complete search history.

(56) References Cited

U.S. PATENT DOCUMENTS

| | | | |
|---|---|---|---|
| 4,315,307 A | 2/1982 | Jacquart | |
| 6,313,598 B1 | 11/2001 | Tamba et al. | |
| 7,505,294 B2* | 3/2009 | Ahmed et al. | 363/141 |
| 8,300,443 B2* | 10/2012 | Takizawa | 363/147 |
| 2010/0001790 A1 | 1/2010 | Hashimoto et al. | |
| 2013/0155745 A1* | 6/2013 | Tanaka et al. | 363/131 |

FOREIGN PATENT DOCUMENTS

| | | |
|---|---|---|
| CN | 201194374 Y | 2/2009 |
| CN | 101621061 A | 1/2010 |
| CN | 201956925 U | 8/2011 |
| EP | 2154784 A1 | 2/2010 |
| JP | S56-2735 A | 1/1981 |
| JP | S56-025373 A | 3/1981 |

(Continued)

OTHER PUBLICATIONS

An Office Action; "Notification of Reason(s) for Refusal," issued by the Japanese Patent Office on Oct. 7, 2014, which corresponds to Japanese Patent Application No. 2011-272961 and is related to U.S. Appl. No. 13/677,028; with English language partial translation.

(Continued)

*Primary Examiner* — Jeffrey Sterrett
(74) *Attorney, Agent, or Firm* — Studebaker & Brackett PC

(57) ABSTRACT

Among first IGBTs and first MOSFETs, a transistor arranged near a first gate control circuit gives, through a gate thereof, a gate control signal supplied from the first gate control circuit to a gate of a transistor arranged at a position farther from the first gate control circuit. Among second IGBTs and second MOSFETs, a transistor arranged near a second gate control circuit gives, through a gate thereof, a gate control signal supplied from the second gate control circuit to a gate of a transistor arranged at a position farther from the second gate control circuit.

14 Claims, 13 Drawing Sheets

(56) References Cited

FOREIGN PATENT DOCUMENTS

| | | |
|---|---|---|
| JP | S57-39144 U | 3/1982 |
| JP | S59-111332 A | 6/1984 |
| JP | S61-072411 A | 4/1986 |
| JP | 04-354156 | 12/1992 |
| JP | 05-090933 | 4/1993 |
| JP | H06-141542 A | 5/1994 |
| JP | 2000-091499 A | 3/2000 |
| JP | 2002-016486 A | 1/2002 |
| JP | 2002-165439 A | 6/2002 |
| JP | 2005-295653 A | 10/2005 |
| WO | 00/72433 A1 | 11/2000 |

OTHER PUBLICATIONS

The first Office Action issued by the Chinese Patent Office on Jan. 7, 2015, which corresponds to Chinese Patent Application No. 201210542282.9 and is related to U.S. Appl. No. 13/677,028; with English language partial translation.

An Office Action; "Decision of Refusal," issued by the Japanese Patent Office on Jun. 16, 2015, which corresponds to Japanese Patent Application No. 2011-272961 and is related to U.S. Appl. No. 13/677,028; with English language partial translation.

\* cited by examiner

POWER SEMICONDUCTOR DEVICE

BACKGROUND OF THE INVENTION

1. Field of the Invention

The present invention relates to a power semiconductor device, and particularly relates to a power semiconductor device in which an IGBT and a MOSFET operated in parallel are used as switching devices.

2. Description of the Background Art

In a switching device such as an IGBT (insulated gate bipolar transistor), a configuration in which a MOSFET (MOS field effect transistor) is connected in parallel with the IGBT for the purpose of reducing a switching loss has conventionally been studied.

For example, Japanese Patent Application Laid-Open No. 4-354156 (1992) discloses, in FIG. 5, a configuration in which gates of an IGBT and a MOSFET connected in parallel with each other are commonly connected and they are driven by a common gate drive circuit.

In a case where such a configuration is adopted, by making use of a difference between the threshold voltages of the IGBT and the MOSFET, turn-off characteristics of the MOSFET can be reflected in transient characteristics at a time of turning off, so that turn-off characteristics of the IGBT that causes a large turn-off loss are absorbed, to thereby reduce a switching loss.

In the configuration disclosed in Japanese Patent Application Laid-Open No. 4-354156 (1992) mentioned above, an ON threshold voltage of the IGBT is set higher than an ON threshold voltage of the MOSFET, and therefore a total current flows in the MOSFET without fail in a transient state at a switching time. To deal with it, the current rating of the MOSFET has to be increased, which makes it difficult to reduce the chip size of the MOSFET. Thus, there has been a problem that it is difficult to downsize the whole of a device.

SUMMARY OF THE INVENTION

An object of the present invention is to downsize the whole of a device in a power semiconductor device in which an IGBT and a MOSFET operated in parallel are used as switching devices.

A first aspect of a power semiconductor device according to the present invention is a power semiconductor device including, in a modularized manner: an inverter including first and second switching parts that operate in a complementary manner, the first and second switching parts being interposed in series with each other between a first power supply line that supplies a first voltage and a second power supply line that supplies a second voltage; and first and second control circuits for controlling switching operations of the first and second switching parts, respectively. The first switching part includes a first IGBT and a first MOSFET, one main electrode of each of the first IGBT and the first MOSFET being connected to the first power supply line and the other main electrode of each of the first IGBT and the first MOSFET being connected to an output node of the inverter. The second switching part includes a second IGBT and a second MOSFET, one main electrode of each of the second IGBT and the second MOSFET being connected to the second power supply line and the other main electrode of each of the second IGBT and the second MOSFET being connected to the output node of the inverter. In a plane layout of the power semiconductor device: the first control circuit is arranged at a position opposed to the first switching part, and one of the first IGBT and the first MOSFET is arranged near the first control circuit while the other of the first IGBT and the first MOSFET is arranged at a position farther from the first control circuit; and the second control circuit is arranged at a position opposed to the second switching part, and one of the second IGBT and the second MOSFET is arranged near the second control circuit while the other of the second IGBT and the second MOSFET is arranged at a position farther from the second control circuit. In the first IGBT and the first MOSFET, a transistor arranged near the first control circuit gives, through a gate thereof, a gate control signal supplied from the first control circuit to a gate of a transistor arranged at the position farther from the first control circuit. In the second IGBT and the second MOSFET, a transistor arranged near the second control circuit gives, through a gate thereof, a gate control signal supplied from the second control circuit to a gate of a transistor arranged at the position farther from the second control circuit.

In the above-described power semiconductor device, it is not necessary that the IGBT and the MOSFET are arranged in parallel with the control circuits. Thus, in the configuration in which the IGBT and the MOSFET in parallel with each other are used as switching devices, the whole of the device can be downsized.

A second aspect of a power semiconductor device according to the present invention is a power semiconductor device including, in a modularized manner: an inverter including first and second switching parts that operate in a complementary manner, the first and second switching parts being interposed in series with each other between a first power supply line that supplies a first voltage and a second power supply line that supplies a second voltage; and first and second control circuits for controlling switching operations of the first and second switching parts, respectively. The first switching part includes a first IGBT and a first MOSFET, one main electrode of each of the first IGBT and the first MOSFET being connected to the first power supply line and the other main electrode of each of the first IGBT and the first MOSFET being connected to an output node of the inverter. The second switching part includes a second IGBT and a second MOSFET, one main electrode of each of the second IGBT and the second MOSFET being connected to the second power supply line and the other main electrode of each of the second IGBT and the second MOSFET being connected to the output node of the inverter. A gate control signal supplied from the first control circuit is given to a gate of the first IGBT through a first resistive element. The gate control signal supplied from the first control circuit is given to the first MOSFET through a second resistive element. A resistance value of the second resistive element is higher than a resistance value of the first resistive element, and a diode is connected in inverse parallel with the second resistive element. A gate control signal supplied from the second control circuit is given to a gate of the second IGBT through a first resistive element. The gate control signal supplied from the second control circuit is given to the second MOSFET through a second resistive element. A resistance value of the second resistive element is higher than a resistance value of the first resistive element, and a diode is connected in inverse parallel with the second resistive element.

In the above-described power semiconductor device, the resistance value of the second resistive elements connected to the gates of the first and second MOSFETs is higher than the resistance value of the first resistive elements, and the diodes are connected in inverse parallel with the second resistive elements. Accordingly, at a time of turning on, the first and second IGBTs are turned on and then the first and second MOSFETs are turned on, while at a time of turning off, the first and second MOSFETs are turned off and then the first and second IGBTs are turned off, because the potentials of the first and second MOSFETs quickly drop through the diodes. Therefore, a current that flows in the first and second MOSFETs at a time of switching is suppressed. Thus, it is not necessary that the first and second MOSFETs have the rating corresponding to the maximum current flow. Therefore, the first and second MOSFETs can be downsized, and the whole of the device can be downsized.

A third aspect of a power semiconductor device according to the present invention is a power semiconductor device including, in a modularized manner: an inverter including first and second switching parts that operate in a complementary manner, the first and second switching parts being interposed in series with each other between a first power supply line that supplies a first voltage and a second power supply line that supplies a second voltage; and first and second control circuits for controlling switching operations of the first and second switching parts, respectively. The first switching part includes a first IGBT and a first MOSFET, one main electrode of each of the first IGBT and the first MOSFET being connected to the first power supply line and the other main electrode of each of the first IGBT and the first MOSFET being connected to an output node of the inverter. The second switching part includes a second IGBT and a second MOSFET, one main electrode of each of the second IGBT and the second MOSFET being connected to the second power supply line and the other main electrode of each of the second IGBT and the second MOSFET being connected to the output node of the inverter. In a plane layout of the power semiconductor device: the first control circuit is arranged at a position opposed to the first switching part, and one of the first IGBT and the first MOSFET is arranged near the first control circuit while the other of the first IGBT and the first MOSFET is arranged at a position farther from the first control circuit; and the second control circuit is arranged at a position opposed to the second switching part, and one of the second IGBT and the second MOSFET is arranged near the second control circuit while the other of the second IGBT and the second MOSFET is arranged at a position farther from the second control circuit. Each of the first IGBT and the first MOSFET is a transistor with a vertical structure in which a main current flows perpendicularly to a main surface of a semiconductor substrate. In a transistor within the first switching part which is arranged near the first control circuit, a gate pad connected to a gate of the transistor is provided at the first control circuit side within a plane of the other main electrode side, and a relay pattern is provided at a side opposite to the first control circuit within a plane of the other main electrode side. A first gate control signal supplied from the first control circuit is given to the gate pad while a second gate control signal supplied from the first control circuit is given to the relay pattern, and the second gate control signal is given through the relay pattern to a gate pad of a transistor arranged at the position farther from the first control circuit. Each of the second IGBT and the second MOSFET is a transistor with a vertical structure in which a main current flows perpendicularly to a main surface of a semiconductor substrate. In a transistor within the second switching part which is arranged near the second control circuit, a gate pad connected to a gate of the transistor is provided at the second control circuit side within a plane of the other main electrode side, and a relay pattern is provided at a side opposite to the second control circuit within a plane of the other main electrode side. A first gate control signal supplied from the second control circuit is given to the gate pad while a second gate control signal supplied from the second control circuit is given to the relay pattern, and the second gate control signal is given through the relay pattern to a gate pad of a transistor arranged at the position farther from the second control circuit.

In the above-described power semiconductor device, the first gate control signal is given, through the relay pattern, to the gate pad of the transistor arranged at the position farther from the first control circuit, and the second gate control signal is given, through the relay pattern, to the gate pad of the transistor arranged at the position farther from the second control circuit. Accordingly, an operation of wiring to the devices positioned farther from the first and second control circuits is easy.

A fourth aspect of a power semiconductor device according to the present invention is a power semiconductor device including, in a modularized manner: an inverter including first and second switching parts that operate in a complementary manner, the first and second switching parts being interposed in series with each other between a first power supply line that supplies a first voltage and a second power supply line that supplies a second voltage; and first and second control circuits for controlling switching operations of the first and second switching parts, respectively. The first switching part includes a first IGBT and a first MOSFET, one main electrode of each of the first IGBT and the first MOSFET being connected to the first power supply line and the other main electrode of each of the first IGBT and the first MOSFET being connected to an output node of the inverter. The second switching part includes a second IGBT and a second MOSFET, one main electrode of each of the second IGBT and the second MOSFET being connected to the second power supply line and the other main electrode of each of the second IGBT and the second MOSFET being connected to the output node of the inverter. The first control circuit individually controls switching operations of the first IGBT and the first MOSFET such that the first IGBT is firstly turned on at a time of turning on and the first MOSFET is firstly turned off at a time of turning off. The second control circuit individually controls switching operations of the second IGBT and the second MOSFET such that the second IGBT is firstly turned on at a time of turning on and the second MOSFET is firstly turned off at a time of turning off.

In the above-described power semiconductor device, the switching operations of the first IGBT and the first MOSFET are individually controlled such that, in the first control circuit, the first IGBT is firstly turned on at a time of turning on while the first MOSFET is firstly turned off at a time of turning off. The switching operations of the second IGBT and the second MOSFET are individually controlled such that, in the second control circuit, the second IGBT is firstly turned on at a time of turning on while the second MOSFET is firstly turned off at a time of turning off. Accordingly, in a transient state at a time of switching, a current that flows in the first and second MOSFETs is suppressed. Thus, it is not necessary that the first and second MOSFETs have the rating corresponding to the maximum current flow. Therefore, the first and second MOSFETs can be downsized, and the whole of the device can be downsized.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 are diagrams showing current characteristics and voltage characteristics at a time when an IGBT and a MOSFET are turned on;

FIGS. 13 and 14 are diagrams showing current characteristics and voltage characteristics at a time when the IGBT and the MOSFET are turned on;

DESCRIPTION OF THE PREFERRED EMBODIMENTS

<Preferred Embodiment>

Figure 1:
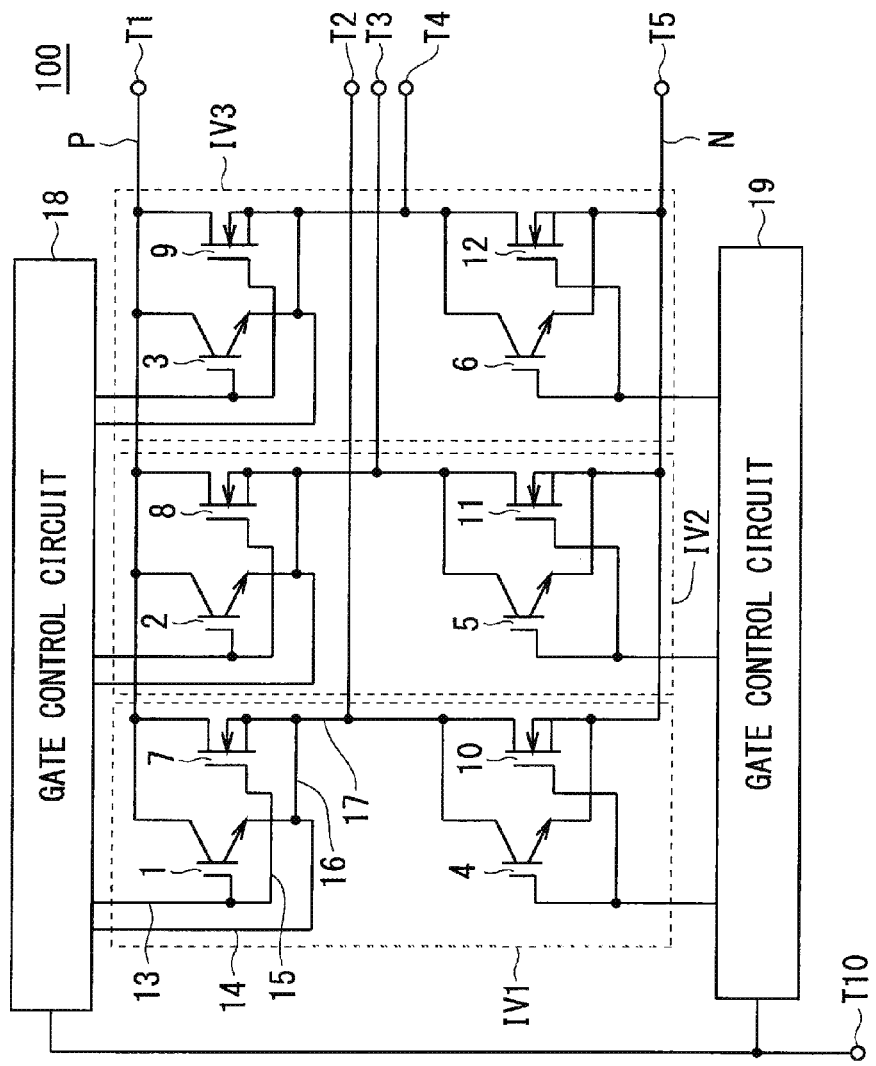
FIG. 1 is a diagram showing a circuit configuration of a three-phase inverter module according to a preferred embodiment of the present invention.

FIG. 1 shows a circuit configuration of a three-phase inverter module 100, as a preferred embodiment of a power semiconductor device according to the present invention.

The three-phase inverter module 100 shown in FIG. 1 includes three inverters IV1 to IV3.

The inverter IV1 includes MOSFETs (MOS field effect transistor) 7 and 10 and IGBTs (insulated gate bipolar transistor) 1 and 4, provided between a power supply line P and a power supply line N. The MOSFETs 7 and 10 are connected in series with each other. The IGBTs 1 and 4 are connected in parallel with the MOSFETs 7 and 10, respectively. The power supply line P is connected to a terminal T1 to which a power supply voltage is given. The power supply line N is connected to a terminal T5 to which a reference voltage is given. The source and drain of each of the MOSFETs 7 and 10 are commonly connected to a terminal T2. The IGBT 1 and the MOSFET 7 are switching devices at the high-potential side, and they form a switching part at the high-potential side. The IGBT 4 and the MOSFET 10 are switching devices at the low-potential side, and they form a switching part at the low-potential side.

The term "MOS" has been used for the laminated structure of metal/oxide/semiconductor in the old times, and was named from the initial letters of Metal-Oxide-Semiconductor. However, especially in a field effect transistor having a MOS structure (hereinafter, simply referred to as "MOS transistor"), from the viewpoint of the recent improvement in the integration and the manufacturing process etc., the materials of a gate insulating film and a gate electrode have been improved.

For example, in the MOS transistor, mainly from the viewpoint of forming the source and the drain in a self-alignment manner, polycrystalline silicon, instead of a metal, has now been adopted as the material of the gate electrode. Although a material having a high dielectric constant is adopted as the material of the gate insulating film from the viewpoint of improving the electrical characteristics, this material is not limited to oxides.

Therefore, adoption of the term "MOS" is not necessarily limited to a laminated structure of metal/oxide/semiconductor, and this specification does not assume such a limitation. That is, in view of common general technical knowledge, the term "MOS" herein not only is an abbreviation derived from the word origin but also includes a stacked structure of conductor/insulator/semiconductor in a broad sense.

The inverter IV2 has the same configuration, and includes MOSFETs 8 and 11 connected in series with each other between the power supply lines P and N, and IGBTs 2 and 5 connected in parallel with the MOSFETs 8 and 11, respectively. The source and drain of each of the MOSFETs 8 and 11 are commonly connected to a terminal T3. The IGBT 2 and the MOSFET 8 are switching devices at the high-potential side, and they form a switching part at the high-potential side. The IGBT 5 and the MOSFET 11 are switching devices at the low-potential side, and they form a switching part at the low-potential side.

The inverter IV3 includes MOSFETs 9 and 12 connected in series with each other between the power supply lines P and N, and IGBTs 3 and 6 connected in parallel with the MOSFETs 9 and 12, respectively. The source and drain of each of the MOSFETs 9 and 12 are commonly connected to a terminal T4. The IGBT 3 and the MOSFET 9 are switching devices at the high-potential side, and they form a switching part at the high-potential side. The IGBT 6 and the MOSFET 12 are switching devices at the low-potential side, and they form a switching part at the low-potential side.

The gates of the MOSFET 7 and the IGBT 1 are commonly connected to a gate control circuit 18, and the source of the MOSFET 7 and the emitter of the IGBT 1 are commonly connected to the gate control circuit 18.

The gates of the MOSFET 8 and the IGBT 2 are commonly connected to the gate control circuit 18, and the source of the MOSFET 8 and the emitter of the IGBT 2 are commonly connected to the gate control circuit 18.

The gates of the MOSFET 9 and the IGBT 3 are commonly connected to the gate control circuit 18, and the source of the MOSFET 9 and the emitter of the IGBT 3 are commonly connected to the gate control circuit 18.

Here, connection lines connecting the gates of the IGBTs 1 to 3 to the gate control circuit 18 are referred to as lines 13; connection lines connecting the gates of the IGBTs 1 to 3 to the gates of the MOSFETs 7 to 9, respectively, are referred to as lines 15; connection lines connecting the emitters of the IGBTs 1 to 3 to the sources of the MOSFETs 7 to 9, respectively, are referred to as lines 16; and connection lines connecting the lines 16 to the gate control circuit 18 are referred to as lines 14. Connection lines connecting the lines 16 to the terminals T2 to T4, respectively, are referred to as lines 17.

The gates of the MOSFET 10 and the IGBT 4 are commonly connected to a gate control circuit 19. The gates of the MOSFET 11 and the IGBT 5 are commonly connected to the gate control circuit 19. The gates of the MOSFET 12 and the IGBT 6 are commonly connected to the gate control circuit 19.

The gate control circuits 18 and 19 are given the reference voltage through a terminal T10.

Figure 2:
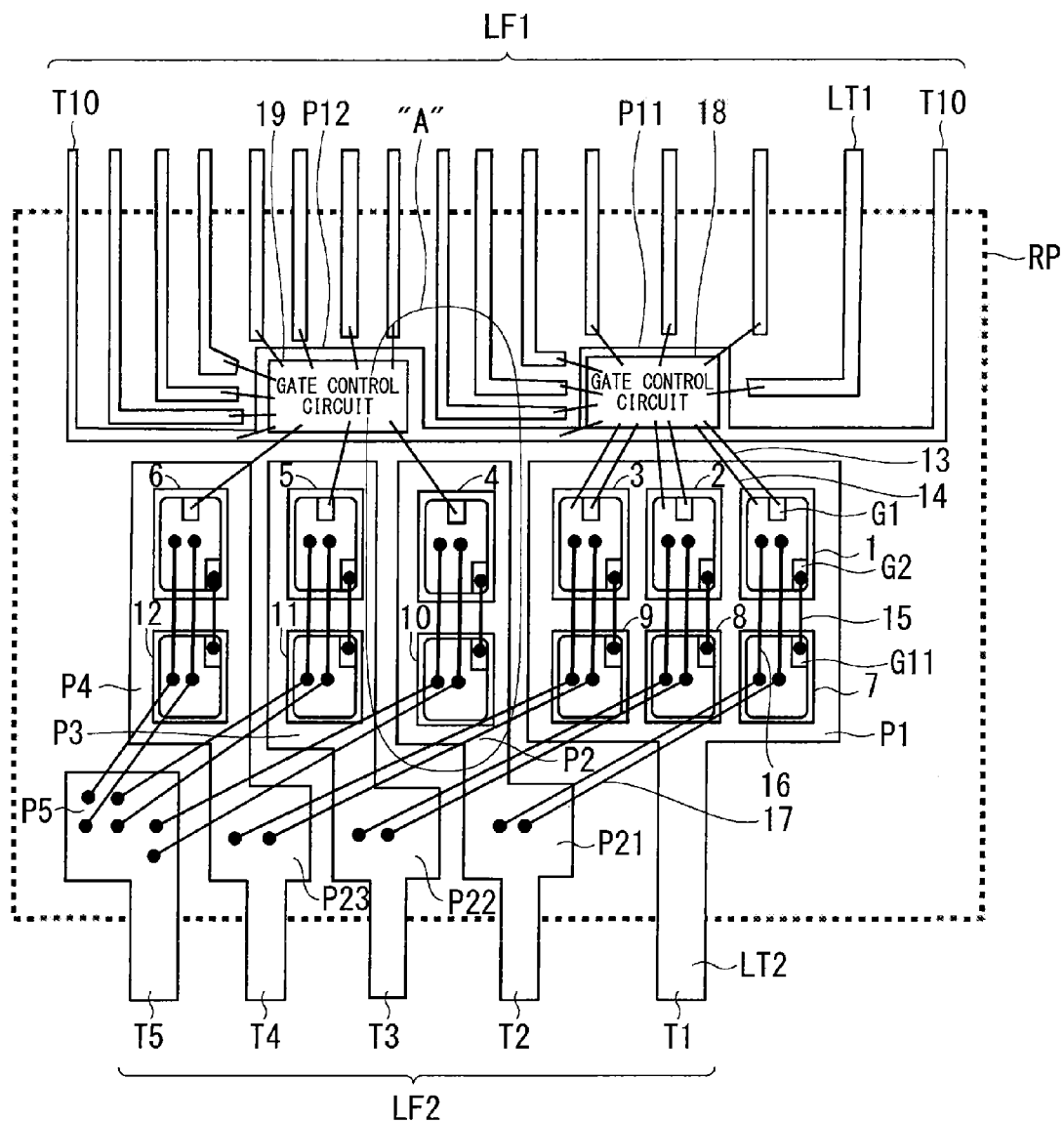
FIG. 2 is a diagram showing an internal configuration of the three-phase inverter module according to the preferred embodiment of the present invention.

FIG. 2 is a diagram showing an internal configuration of the three-phase inverter module 100. Although the three-phase inverter module 100 is sealed with a resin and formed as a package, the illustration of the sealing resin is omitted and a region where a resin package RP is formed is illustrated with the broken line in FIG. 2.

As shown in FIG. 2, in the three-phase inverter module 100, the gate control circuits 18 and 19 are arranged at one long side of the resin package RP having a rectangular shape, and the IGBTs 1 to 6 and the MOSFETs 7 to 12 are arranged at the other long side thereof.

As shown in FIG. 2, the three-phase inverter module 100 has the gate control circuits 18 and 19 for controlling the gates of the switching devices, and therefore is referred to as IPMs (Intelligent Power Module).

A lead frame LF1 is arranged at the side where the gate control circuits 18 and 19 are arranged, and a lead frame LF2 is arranged at the side where the IGBTs 1 to 6 and the MOSFETs 7 to 12 are arranged.

The lead frame LF1 includes a plurality of leads LT1 and die pads P11 and P12 on which the gate control circuits 18 and 19 are mounted, respectively.

The die pads P11 and P12 are arranged in parallel with the long side of the resin package RP, and commonly connected. Each of the die pads P11 and P12 is connected to any of the leads LT1. Since the reference voltage is given to the gate control circuits 18 and 19 through these leads LT1, these leads LT1 function as the terminal T10 of FIG. 1.

The lead frame LF2 includes five leads LT2, die pads P1 to P4, and wire bonding regions P5 and P21 to P23.

The die pads P1 to P4 are arranged in parallel with the long side of the resin package RP, and independent of one another. The wire bonding regions P21 to P23 are connected to the die pads P2 to P4, respectively, in an integrated manner. The leads LT2 are connected to the wire bonding regions P21 to P23, respectively, in an integrated manner. The leads LT2 are connected to the die pad P1 and the wire bonding region P5, respectively, in an integrated manner. Thus, the wire bonding regions P21 to P23 and the wire bonding region P5 are arranged in parallel with the long side of the resin package RP.

The lead LT2 integrated with the die pad P1 corresponds to the terminal T1 shown in FIG. 1; the leads LT2 integrated with the wire bonding regions P21 to P23, respectively, correspond to the terminal T2 to T4; and the lead LT2 integrated with the wire bonding region P5 corresponds to the terminal T5.

Referring to FIG. 2, on an end edge of the die pad P1 at the lead frame LF1 side, the IGBTs 1 to 3 are arranged opposed to the gate control circuit 18. On end edges of the die pads P2 to P4 at the lead frame LF1 side, the IGBTs 4 to 6 are arranged opposed to the gate control circuit 19.

On the die pad P1, the MOSFETs 7 to 9 are arranged opposed to the IGBTs 1 to 3, respectively. On the die pads P2 to P4, the MOSFETs 10 to 12 are arranged opposed to the IGBTs 4 to 6, respectively.

Figure 3:
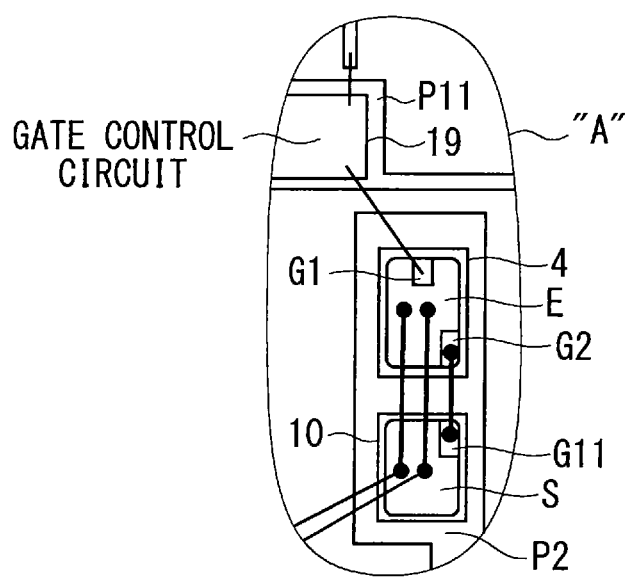
FIG. 3 is a diagram showing a part of the internal configuration of the three-phase inverter module according to the preferred embodiment of the present invention.

FIG. 3 shows details of a region "A" in FIG. 2. The region "A" is a region including the die pad P2, the IGBT 4 and the MOSFET 10 arranged thereon, and surroundings thereof. With reference to this drawing, configurations of the IGBT and the MOSFET will be described.

As shown in FIG. 3, the IGBT 4 is an IGBT with a vertical structure in which a collector is at the side in contact with a main surface of the die pad P2 and an emitter E is at the opposite side, and a main current flows perpendicularly to a main surface of a semiconductor substrate. Two gate pads G1 and G2 are provided in a plane of the emitter E side.

More specifically, the gate pad G1 is provided in an end edge portion of one short side of a rectangular shape at the emitter E side, and the gate pad G2 is provided in an end edge portion of the other short side. The gate pads G1 and G2 are connected to each other within the IGBT 4, and a gate control signal supplied from the gate control circuit 19 to the gate pad G1 can be extracted from the gate pad G2. In mounting the IGBT 4 on the die pad P2, the IGBT 4 is arranged such that the gate pad G1 is directed toward the gate control circuit 19 side.

As shown in FIG. 3, the MOSFET 10 is a MOSFET with a vertical structure in which a drain is at the side in contact with the main surface of the die pad P2 and a source S is at the opposite side, and a main current flows perpendicularly to a main surface of a semiconductor substrate. A gate pad G11 is provided in a plane of the source S side.

More specifically, the gate pad G11 is provided in an end edge portion of one short side of a rectangular shape at the source S side. In mounting the MOSFET 10 on the die pad P2, the MOSFET 10 is arranged such that the gate pad G11 is directed toward the IGBT 4 side. In a case where the IGBT 4 and the MOSFET 10 are mounted on the die pad P2, it is preferable to provide the gate pads G2 and G11 such that the gate pad G2 of the IGBT 4 and the gate pad G11 of the MOSFET 10 are opposed to each other, because this is advantageous at a time of a wire bonding process. The same is applied to configurations of the IGBTs 1 to 3, 5, and 6 and the MOSFETs 7 to 9, 11, and 12.

As shown in FIG. 2, the gate pad G1 (FIG. 3) and the emitter E (FIG. 3) of each of the IGBTs 1 to 3 are connected to the gate control circuit 18 by means of wire bonding. A wiring that connects the gate control circuit 18 and the gate pad G1 to each other is the line 13, and a wiring that connects the gate control circuit 18 and the source S to each other is the line 14.

The gate pad G2 (FIG. 3) of each of the IGBTs 1 to 3 is connected to the gate pad G11 (FIG. 3) of each of the MOSFETs 7 to 9 by means of wire bonding. A wiring that implements this connection is the line 15.

The emitter E (FIG. 3) of each of the IGBTs 1 to 3 is connected to the source S (FIG. 3) of each of the MOSFETs 7 to 9 by means of wire bonding. A wiring that implements this connection is the line 16.

The source S (FIG. 3) of each of the MOSFETs 7 to 9 is connected to each of the wire bonding regions P21 to P23 by means of wire bonding. A wiring that implements this connection is the line 17.

As shown in FIG. 2, the source S (FIG. 3) and the gate pad G1 (FIG. 3) of each of the IGBTs 4 to 6 are connected to the gate control circuit 19 by means of wire bonding, and the gate pad G2 (FIG. 3) of each of the IGBTs 4 to 6 is connected to the gate pad G11 (FIG. 3) of each of the MOSFETs 10 to 12 by means of wire bonding.

The emitter E (FIG. 3) of each of the IGBTs 4 to 6 is connected to the source S (FIG. 3) of each of the MOSFETs 10 to 12 by means of wire bonding, and the source S (FIG. 3) of each of the MOSFETs 10 to 12 is connected to the wire bonding region P5 by means of wire bonding.

As shown in FIG. 2, in the IGBTs 1 to 6 arranged near the gate control circuits 18 and 19, the gate pads G1 and G2 are provided, and the gate pads G1 and the gate control circuits 18 and 19 are connected to each other by means of wire bonding. The gate pads G11 of the MOSFETs 7 to 12 arranged at positions farther from the gate control circuits 18 and 19 are connected to the gate pads G2 of the IGBTs 1 to 6, respectively, by means of wire bonding. This can suppress an increase in the size of the whole of a device having the configuration in which the IGBT and the MOSFET in parallel with each other are used as switching devices.

That is, in a case where the MOSFETs 7 to 12 are arranged near the gate control circuits 18 and 19, it is necessary that two gate pads that are similar to the gate pads G1 and G2 are provided in each of the MOSFETs 7 to 12. As a result, an effective area, as a semiconductor chip, of the each of MOSFETs 7 to 12 is reduced.

In order to reduce the on-resistance of a MOSFET, a chip size is increased and costs are also increased. Providing two gate pads in such a MOSFET reduces the effective area, and therefore the chip size has to be further increased in order to maintain the effective area. The increase in the chip size of the MOSFET increases the size of the whole of the device.

However, in a case where the MOSFETs 7 to 12 are arranged at positions farther from the gate control circuits 18 and 19, the number of gate pads required is one. Thus, a reduction in the effective area is suppressed, and the chip size need not be increased. As a result, an increase in the size of the whole of the device is suppressed.

<Modification 1>

In the configuration described above, the IGBTs 1 to 6 are arranged near the gate control circuits 18 and 19 while the MOSFETs 7 to 12 are arranged at positions farther from the gate control circuits 18 and 19. In a case where such a configuration is adopted, there is a possibility that a path through which a main circuit current flows overlaps a gate charging loop so that a gate-emitter voltage of the IGBTs 1 to 6 drops.

Figure 4:
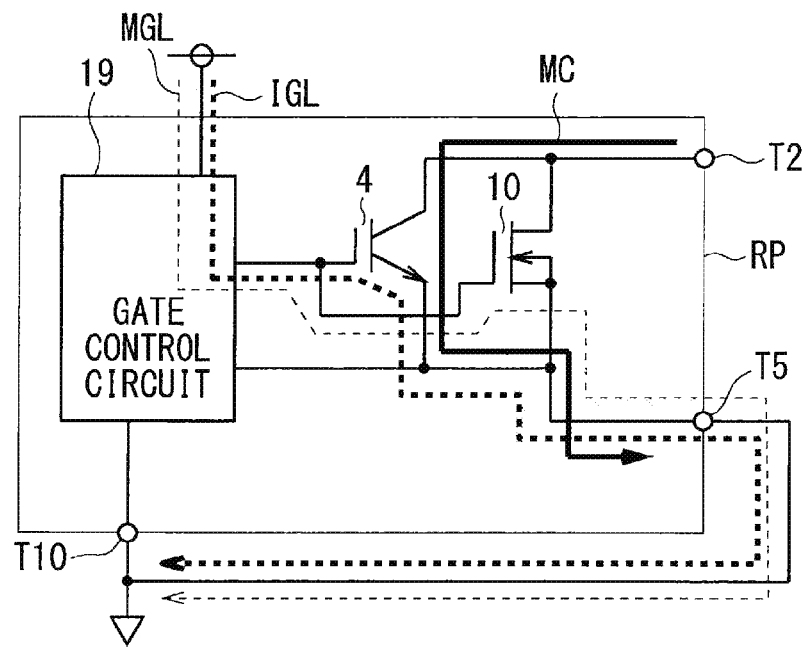
FIGS. 4 and 5 are diagrams for explaining a mechanism of drop in a gate-emitter voltage.

This mechanism will be described with reference to FIG. 4. FIG. 4 shows a configuration in which a reference potential is derived from a reference potential of the gate control circuit 19 within the module.

In FIG. 4, for simplification, only the pair of the MOSFET 10 and the IGBT 4 is shown. FIG. 4 schematically shows a gate charging loop IGL of the IGBT 4, a gate charging loop MGL of the MOSFET 10, and a main circuit current path MC (when an overload occurs, most of the main circuit current flows in the IGBT).

As shown in FIG. 4, the main circuit current path MC includes a part in which the flow overlaps the gate charging loop IGL of the IGBT 1 and the gate charging loop MGL of the MOSFET 10. Thus, there is a possibility that the gate-emitter voltage of the IGBT 4 drops when an overload occurs.

Figure 5:
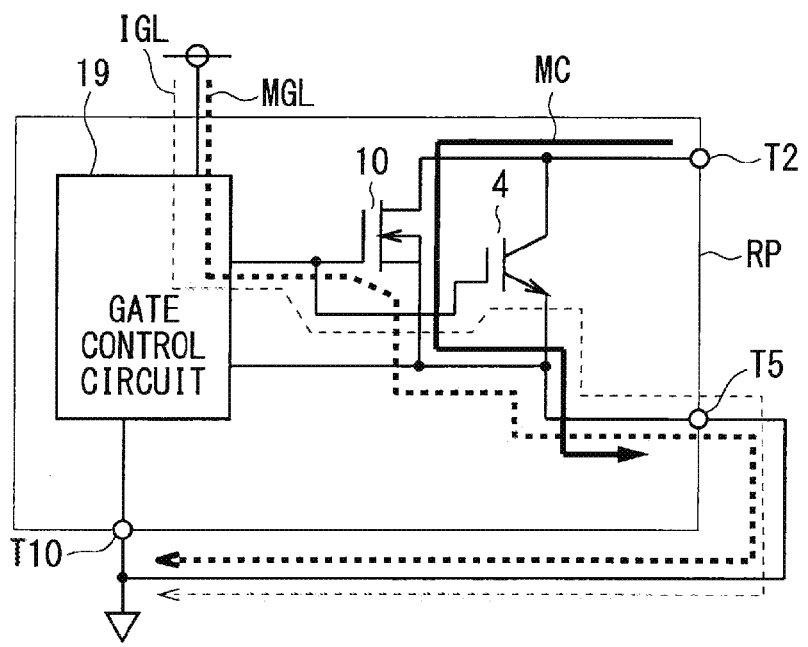

On the other hand, in a case where the MOSFET 10 is arranged near the gate control circuit 19 as shown in FIG. 5, the ratio of overlap between the gate charging loop IGL of the IGBT 7 and the main circuit current path MC decreases, and thus the rate of drop of the gate-emitter voltage of the IGBT 4 can be lowered.

More specifically, by arranging the MOSFETs 7 to 12 near the gate control circuits 18 and 19 while arranging the IGBTs 1 to 6 at positions farther from the gate control circuits 18 and 19, the rate of drop of the gate voltage can be lowered. However, in this case, the gate pads G1 and G2 are provided in the MOSFETs 7 to 12, and the gate pads G2 are connected to the gate pads G11 provided in the IGBTs 1 to 6, respectively, by means of wire bonding.

In this manner, arranging the MOSFETs 7 to 12 near the gate control circuits 18 and 19 can suppress drop of the gate-emitter voltage of the IGBT which is caused by the main circuit current when an overload occurs. Thus, a loss caused when an overload occurs can be reduced.

<Modification 2>

The three-phase inverter module 100 described above is configured such that a threshold voltage of the IGBT is set lower than a threshold voltage of the MOSFET and, in a transient state at a time of switching, a total current flows in the IGBT side.

In the configuration in which an IGBT and a MOSFET in parallel with each other are used as switching devices, in general, a threshold voltage of the MOSFET is set lower, and such a sequence that the IGBT is turned off and then the MOSFET is turned off is always adopted.

In this case, an effect that a tail current is suppressed so that a turn-off loss is reduced, is exerted. However, in a transient state, the total current (IGBT current+MOSFET current) inevitably flows in the MOSFET, and therefore it has been difficult to downsize the MOSFET.

On the other hand, by setting the threshold voltage of the IGBT lower than the threshold voltage of the MOSFET, a current flowing in the MOSFET at a time of switching is suppressed. Thus, the MOSFET can be downsized, and the whole of the module can be downsized.

Here, operations of the IGBT and the MOSFET at a time of switching will be described with reference to FIGS. 6 to 8.

Figure 6:
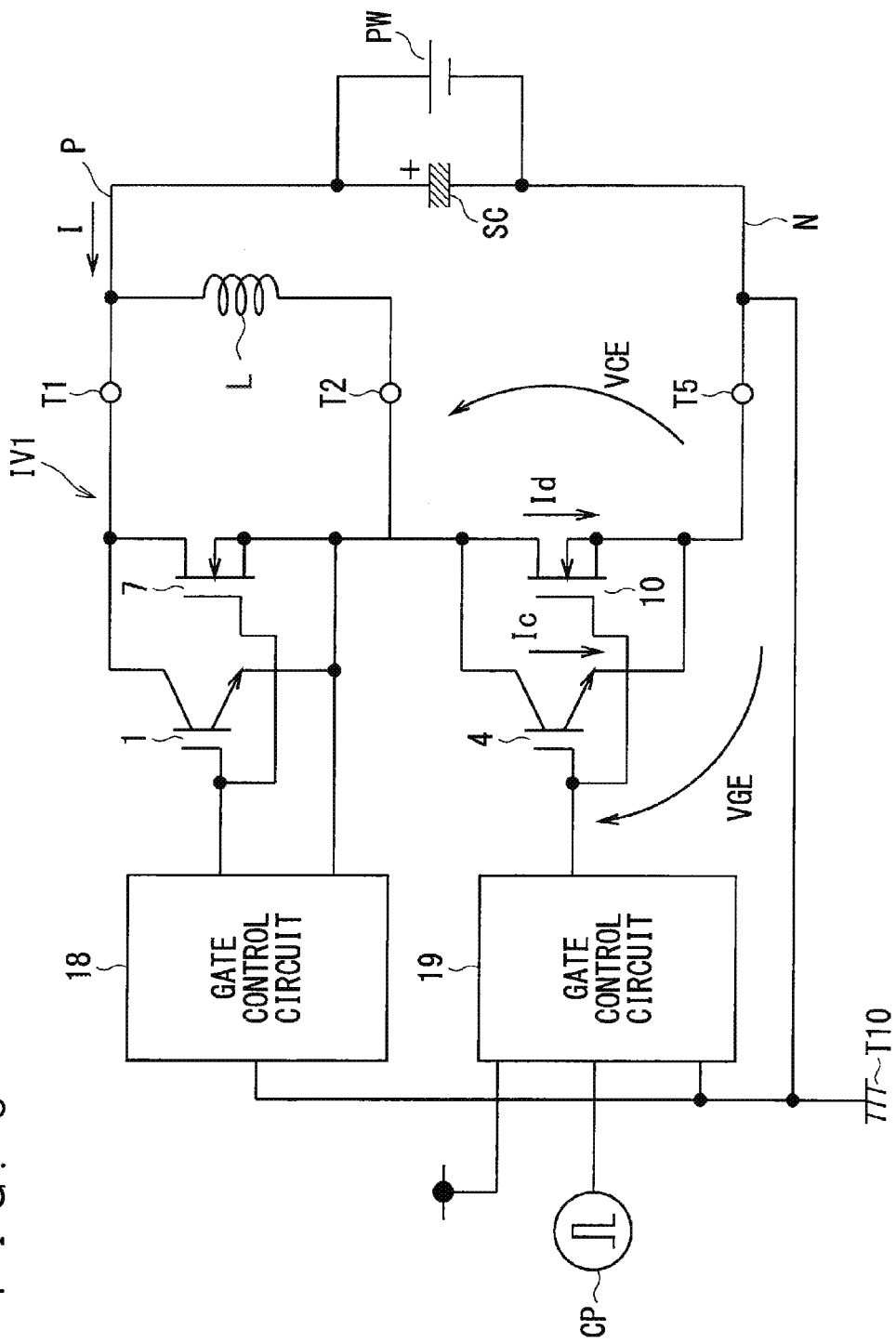
FIG. 6 is a diagram for explaining an operation of an inverter alone in a three-phase inverter module according to a modification 2 of the preferred embodiment of the present invention.

FIG. 6 is a diagram for explaining an operation of the inverter IV1 alone shown in FIG. 1, showing a configuration in a case where the inverter IV1 is connected to an inductance load. In FIG. 6, the same parts of the configuration as those shown in FIG. 1 are denoted by the same reference numerals, and redundant descriptions are omitted.

In FIG. 6, an external capacitor SC is connected between the terminals T1 and T5. This is for smoothing a voltage rectified by a rectifier circuit PW and supplied to between the lines P and N. An inductance load L is connected to the terminal T2 to which an output of the inverter IV1 is given. In the following, a switching operation of the IGBT 4 and the MOSFET 10 at the low-potential side is described, and therefore in FIG. 6, for convenience of illustration, a configuration in which a control signal CP is given only to the gate control circuit 19 is shown.

Figure 7:
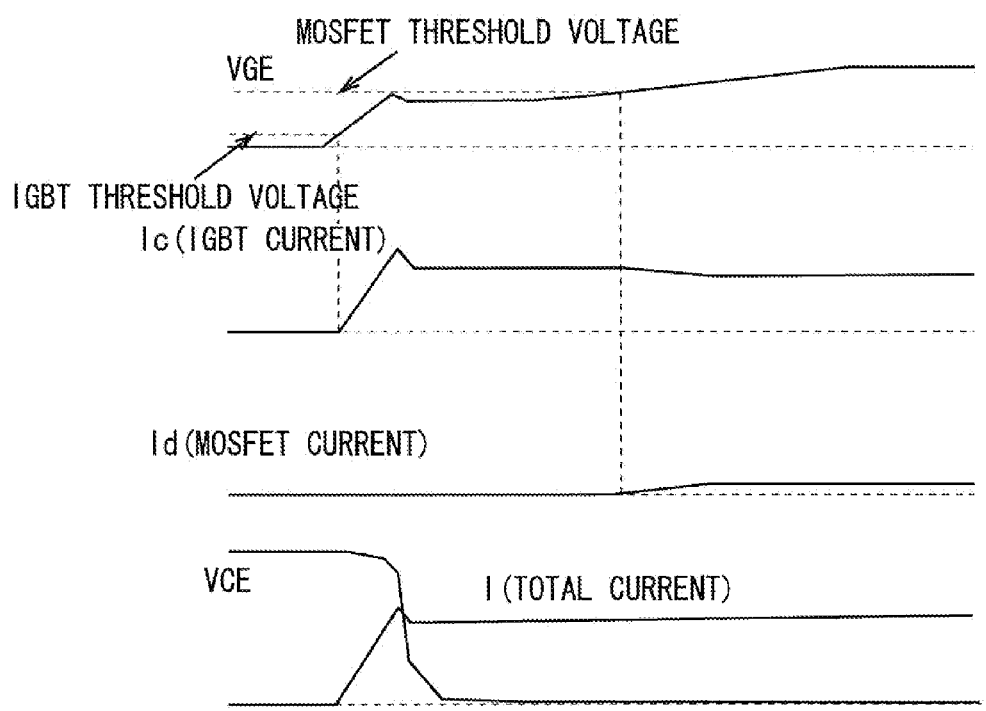

FIG. 7 is a diagram showing current characteristics and voltage characteristics at a time when the IGBT 4 and the MOSFET 10 are turned on, in a relatively middle to high current region in which most of a load current flows in an IGBT in a steady state. FIG. 8 is a diagram showing current characteristics and voltage characteristics at a time when the IGBT 4 and the MOSFET 10 are turned off.

In FIG. 7, in a case where the control signal CP is changed from a low potential ("L") to a high potential ("H") to cause turn-on, when a gate voltage VGE is given to the IGBT 4 and the MOSFET 10, the IGBT 4 is firstly turned on so that an IGBT current Ic starts to flow, because the threshold voltage of the IGBT 4 is lower.

Then, when the gate voltage VGE reaches the threshold voltage of the MOSFET 10, the MOSFET 10 is turned on so that a MOSFET current Id starts to flow. At a time point when the MOSFET 10 is turned on, a predetermined time period has elapsed after the IGBT 4 was turned on, and therefore the IGBT 4 is in a steady state. Thus, most of the current flows in the IGBT 4, and little current flows in the MOSFET 10.

When the IGBT 4 is fully turned on so that a collector-emitter voltage VCE of the IGBT 4 reaches almost zero and further the MOSFET 10 is turned on, a total current I becomes substantially constant.

In this manner, setting the threshold voltage of the IGBT lower than the threshold voltage of the MOSFET can suppress the current that flows in the MOSFET at a time of turning on.

Figure 8:
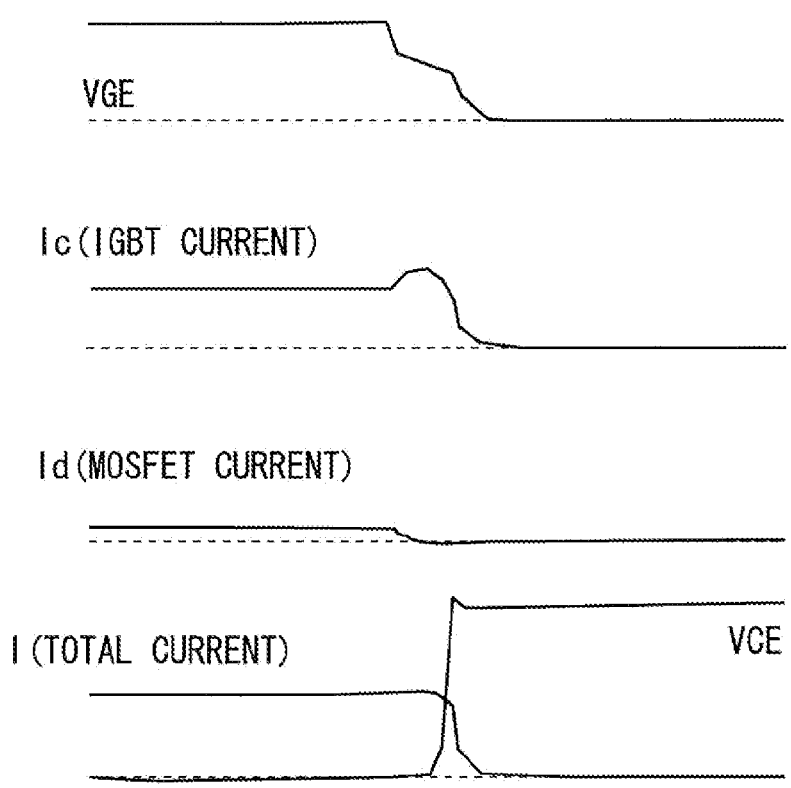

In FIG. 8, in a case where the control signal CP is changed from "H" to "L" to cause turn-off, when the gate voltage VGE having been given to the IGBT 4 and the MOSFET 10 starts to drop, the MOSFET 10 is firstly turned off so that the MOSFET current Id starts to drop, because the threshold voltage of the MOSFET 10 is higher. Then, as the gate voltage VGE drops, the IGBT current Ic starts to drop, and as the gate voltage VGE falls below the threshold voltage of the IGBT 4, the IGBT 4 is turned off so that the flow of the IGBT current Ic is stopped.

When the IGBT 4 is fully turned off so that the collector-emitter voltage VCE of the IGBT 4 rises, the total current I becomes zero.

In this manner, in a case where the threshold voltage of the IGBT is set lower than the threshold voltage of the MOSFET, at a time of turning off, the MOSFET is firstly turned off. Thus, the total current flows in the IGBT that is in an ON state at that time point, and no current flows in the MOSFET.

As described above, setting the threshold voltage of the IGBT lower than the threshold voltage of the MOSFET suppresses the current that flows in the MOSFET at a time of switching. Thus, it is not necessary that the MOSFET has a rating corresponding to a maximum current flow. Therefore, the MOSFET can be downsized, and the whole of the module can be downsized.

The threshold voltages of the IGBT and the MOSFET are set such that, in a switching transient state, the total current flows in the IGBT side without fail. Here, the setting of the threshold voltage is achieved by the amount of impurities introduced into the channel during a manufacturing process.

<Modification 3>

As shown in FIG. 1, in the configuration in which the IGBT and the MOSFET in parallel with each other are used as switching devices, devices having different characteristics are connected in parallel with each other, and thus there is a possibility of occurrence of gate oscillation. Therefore, the devices positioned farther from the gate control circuits 18 and 19, for example, the MOSFETs 7 to 12, have built-in resistive elements provided in portions thereof between the lower sides of the gate pads and the gates. Accordingly, occurrence of gate oscillation is suppressed.

The device positioned farther from the gate control circuits 18 and 19 has a long gate charging loop and a high parasitic inductance, and therefore the possibility of occurrence of gate oscillation increases. However, providing a built-in resistive element can effectively suppress occurrence of gate oscillation.

The resistance value of the built-in resistive element is set to be a value that does not increase a rise of the gate potential due to a displacement current.

The built-in resistive element may also be provided in the device near the gate control circuits 18 and 19, for example, in the IGBTs 1 to 6.

<Modification 4>

In the configuration described in the modification 2, the threshold voltage of the IGBT is set lower than the threshold voltage of the MOSFET, and thereby the current that flows in the MOSFET at a time of switching is suppressed. Here, the current that flows in the MOSFET at a time of switching can also be suppressed by adopting a configuration which will be described below with reference to FIGS. 9 and 10.

Figure 9:
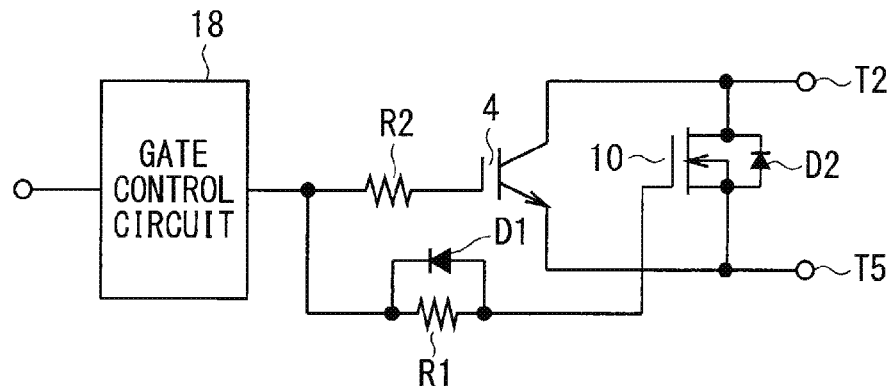
FIG. 9 is a circuit diagram showing a configuration of an IGBT and a MOSFET according to a modification 4 of the preferred embodiment of the present invention.

FIG. 9 is a circuit diagram showing a configuration in which this modification is applied to the IGBT 4 and the MOSFET 10. As shown in FIG. 9, the gate control signal supplied from the gate control circuit 19 is inputted to the IGBT 4 through a resistive element R2 and inputted to the MOSFET 10 through a resistive element R1. A diode D1 is connected in inverse parallel with the resistive element R1. A diode D2, which is an internal parasitic diode, is connected in inverse parallel with the MOSFET 10.

In a case where such a configuration is adopted and the resistance value of the resistive element R1 is set higher than the resistance value of the resistive element R2, at a time of turning on, the IGBT 4 is turned on and then the MOSFET 10 is turned on, while at a time of turning off, the MOSFET 10 is turned off and then the IGBT 4 is turned off because the potential of the MOSFET 10 quickly drops through the diode D1. Accordingly, the current that flows in the MOSFET at a time of switching is suppressed. Thus, it is not necessary that the MOSFET has the rating corresponding to the maximum current flow. Therefore, the MOSFET can be downsized, and the whole of the module can be downsized.

The resistance values of the resistive element R1 and the resistive element R2 are set to be such values that $C1R1 > C2R2$ is satisfied when the gate capacitance of the MOSFET and the gate capacitance of the IGBT are defined as C1 and C2, respectively, and that, at a time of turning on, the IGBT 4 is turned on and then the MOSFET 10 is turned on.

Figure 10:
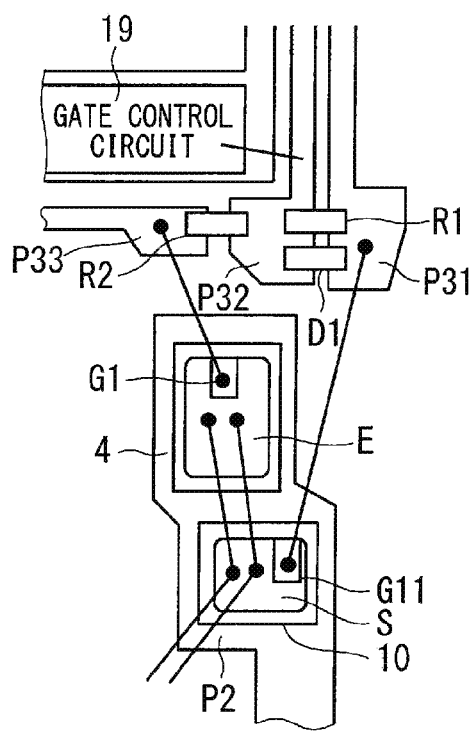
FIG. 10 shows a layout of the IGBT and the MOSFET according to the modification 4 of the preferred embodiment of the present invention.

FIG. 10 shows a layout of the die pad P2, the IGBT 4 and the MOSFET 10 arranged thereon, and a surrounding region thereof.

As shown in FIG. 10, die pads P31, P32, and P33 are provided near the die pad P12 on which the gate control circuit 19 is mounted. The die pads P31 to P33 are included in the lead frame LF1 (FIG. 2), and the ends thereof are leads LT1. These leads LT1 are used in a floating state.

The die pads P31 to P33 are arranged spaced-apart in parallel with one another at positions closer to the die pad P2 than the gate control circuit 19 is. Among the die pads P31 to P33, the die pad P32 is located in the middle.

The gate control circuit 19 and the die pad P32 are connected to each other by means of wire bonding. The die pad P32 and the die pad P31 are connected to each other by the resistive element R1 and the diode D1. The die pad P32 and the die pad P33 are connected to each other by the resistive element R2. The die pad P31 and the gate pad G11 of the MOSFET 11 are connected to each other by means of wire bonding. The die pad P33 and the gate pad G1 of the IGBT 4 are connected to each other by means of wire bonding.

In this case, only one gate pad is provided in the IGBT 4, and the gate pad G11 of the MOSFET 10 is connected to the die pad P31. By adopting the configuration shown in FIGS. 9 and 10, the MOSFET can be downsized, and the whole of the module can be downsized.

<Modification 5>

In the configurations according to the preferred embodiment and its modifications 1 to 4 described above, the gate control circuit gives a common gate control signal to the IGBT and the MOSFET. However, in a case where a configuration which will be described below with reference to FIGS. 11 and 12 is adopted, the gate control circuit can give a gate control signal individually to the IGBT and the MOSFET.

Figure 11:
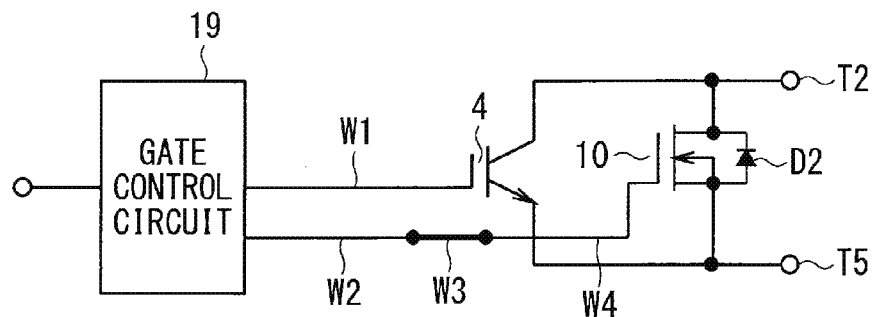
FIG. 11 is a circuit diagram showing a configuration of an IGBT and a MOSFET according to a modification 5 of the preferred embodiment of the present invention.
Figure 12:
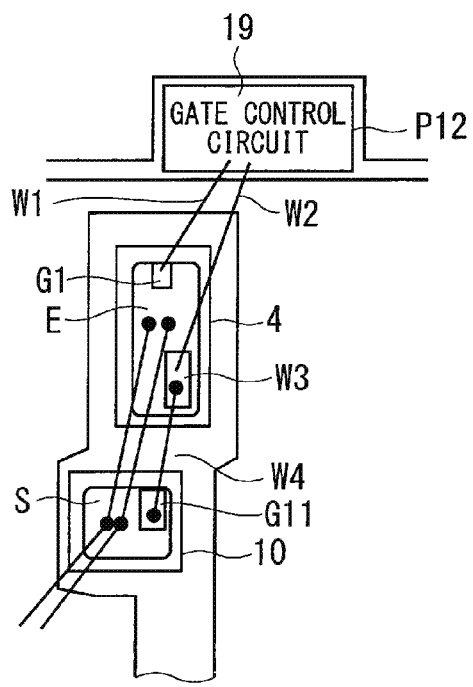
FIG. 12 shows a layout of the IGBT and the MOSFET according to the modification 5 of the preferred embodiment of the present invention.

FIG. 11 is a circuit diagram showing a configuration in which this modification is applied to the IGBT 4 and the MOSFET 10. As shown in FIG. 11, the gate control circuit 19 gives a gate control signal separately to each of the IGBT 4 and the MOSFET 10.

More specifically, the gate control circuit 19 gives a gate control signal to the gate of the IGBT 4 through a wiring W1, and also gives a gate control signal to the gate of the MOSFET 10 through wirings W2, W3, and W4.

In this case, the wiring W3 is a relay pattern provided on the IGBT 4. The wiring W3 and the gate control circuit 19 are connected to each other by the wiring W2, and the wiring W3 and the gate of the MOSFET 10 are connected to each other by the wiring W4.

FIG. 12 shows a layout of the die pad P2, the IGBT 4 and the MOSFET 10 arranged thereon, and a surrounding region thereof.

The gate control circuit 19 and the gate pad G1 of the IGBT 4 are connected to each other by means of wire bonding, and this wire corresponds to the wiring W1. The relay pattern W3 is provided on a surface of the IGBT 4 at the emitter E side, and this corresponds to the wiring W3.

The gate control circuit 19 and the relay pattern W3 are connected to each other by means of wire bonding, and this wire corresponds to the wiring W2. The relay pattern W3 and the gate pad G11 of the MOSFET 11 are connected to each other by means of wire bonding, and this wire corresponds to the wiring W4.

The relay pattern W3 is electrically insulated from the emitter E of the MOSFET 11. A potential difference between the emitter E and the relay pattern W3 is comparable with a potential difference between the emitter E and the gate pad G1. A configuration for implementing the insulation may be a simple one such as arranging the relay pattern W3 on the emitter E with interposition of an insulating material therebetween.

The wirings W2 and W4 are connected to each other through the relay pattern W3, and thereby the gate control signal supplied from the gate control circuit 19 is given to the gate of the MOSFET 10.

In the above-described configuration, the IGBTs 1 to 6 are arranged near the gate control circuits 18 and 19 and the relay patterns W3 are provided in the IGBTs 1 to 6. Alternatively, a configuration may be acceptable in which the MOSFETs 7 to 12 are arranged near the gate control circuits 18 and 19 and the relay patterns W3 are provided in the MOSFETs 7 to 12.

In this manner, the relay patterns W3 are provided in the devices located near the gate control circuits 18 and 19, and the gate control signals are given from the gate control circuits 18 and 19 to the devices positioned farther from the gate control circuits 18 and 19 through the relay patterns W3. Accordingly, an operation of wiring to the device positioned farther from the gate control circuit is easy.

Additionally, the gate control signals are given from the gate control circuit individually to the IGBT and the MOSFET, and timings of turning on and off the IGBT and the MOSFET are individually adjusted. This can achieve a configuration in which the total current flows in the IGBT side in a transient state at the time of switching.

Figure 13:
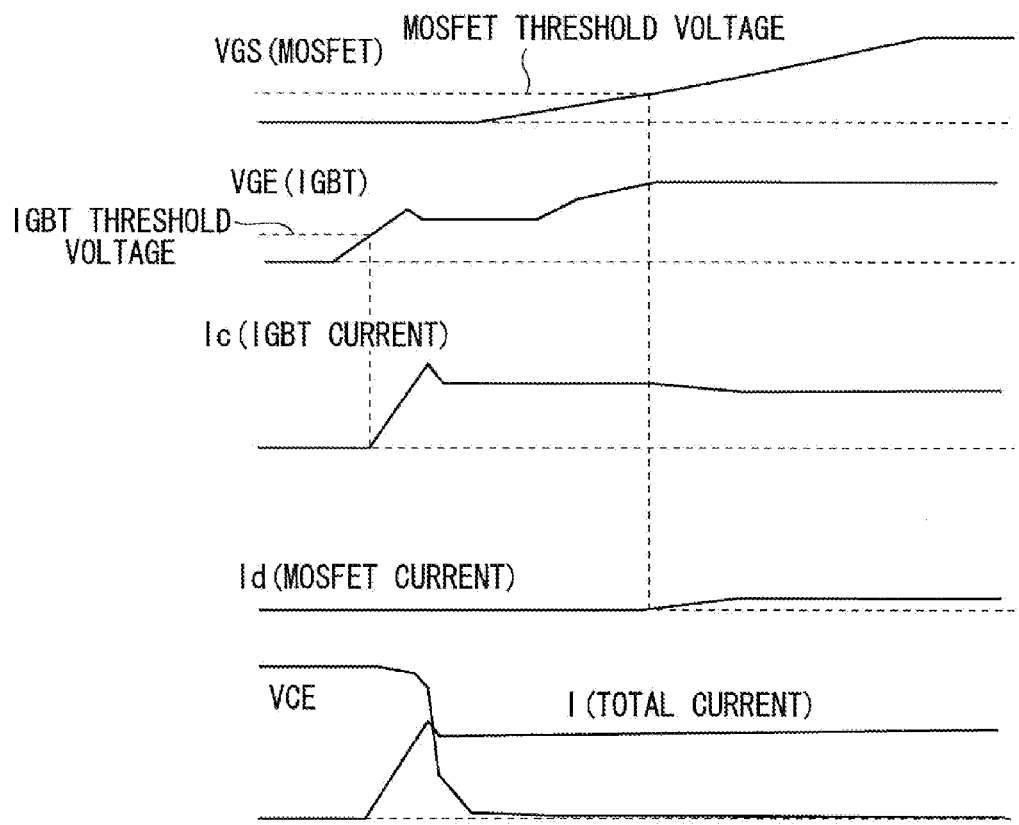
Figure 14:
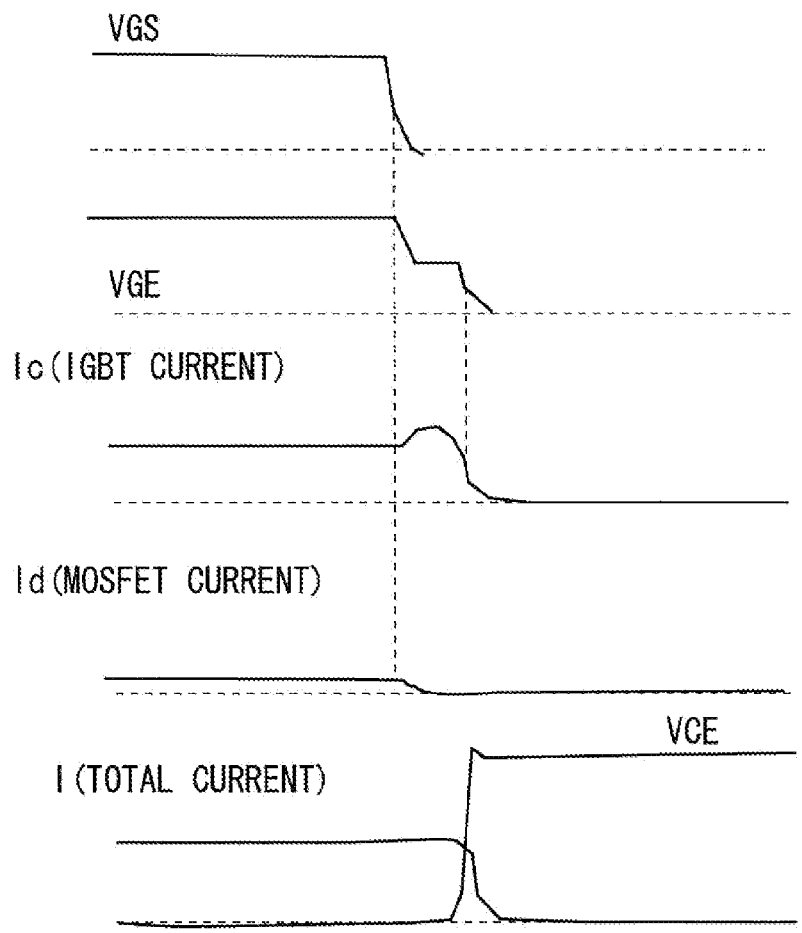

FIG. 13 is a diagram showing current characteristics and voltage characteristics at a time when the IGBT 4 and the MOSFET 10 are turned on. FIG. 14 is a diagram showing current characteristics and voltage characteristics at a time when the IGBT 4 and the MOSFET 10 are turned off.

In FIG. 13, at a time of turning on, the gate control circuit 19 gives the gate control signal so as to cause the IGBT 4 to be firstly turned on. When a gate voltage VGE is given to the IGBT 4 and reaches the threshold voltage, the IGBT 4 is turned on so that the IGBT current Ic starts to flow.

After a delay of a predetermined time period from the IGBT 4, the gate control circuit 19 give the gate control signal to the MOSFET 10. When a gate voltage VGS is given to the MOSFET 10 and reaches the threshold voltage, the MOSFET 10 is turned on so that the MOSFET current Id starts to flow. At a time point when the MOSFET 10 is turned on, a predetermined time period has elapsed after the IGBT 4 was turned on, and therefore the IGBT 4 is in a steady state. Thus, most of the current flows in the IGBT 4, and little current flows in the MOSFET 10.

When the IGBT 4 is fully turned on so that the collector-emitter voltage VCE of the IGBT 4 reaches almost zero and further the MOSFET 10 is turned on, the total current I becomes substantially constant.

In this manner, giving the gate control signal so as to cause the IGBT is firstly turned on at a time of turning on can suppress the current that flows in the MOSFET at a time of turning on.

In FIG. 14, at a time of turning off, the gate control signal is controlled so as to cause the MOSFET 10 is firstly turned off. When the gate voltage VGS having been given to the MOSFET 10 drops and falls below the threshold voltage, the MOSFET 10 is turned off so that the MOSFET current Id starts to drop.

At a timing when the MOSFET 10 is turned off, lowering of the gate control signal given to the IGBT 4 is started. When the gate control signal falls below the threshold voltage, the IGBT 4 is turned off. Since the IGBT 4 is turned off, the flow of the IGBT current Ic is stopped.

When the IGBT 4 is fully turned off so that the collector-emitter voltage VCE of the IGBT 4 rises, the total current I becomes zero.

In this manner, the gate control signal is given so as to cause the MOSFET is firstly turned off at a time of turning off. Thereby, the total current flows in the IGBT that is in an ON state at that time point, and no current flows in the MOSFET.

As described above, individually adjusting the timings of turning on and off the IGBT and the MOSFET suppresses the current that flows in the MOSFET in a transient state at a time of switching. Thus, it is not necessary that the MOSFET has a rating corresponding to a maximum current flow. Therefore, the MOSFET can be downsized, and the whole of the module can be downsized.

In order to individually adjust the timings of turning on and off the IGBT and the MOSFET, the gate control circuits 18 and 19 give, for example via a delay circuit, the gate control signals in such a manner that a time lag occurs between the output of the gate control signal to the IGBT and the output of the gate control signal to the MOSFET.

<Modification 6>

In the configurations according to the preferred embodiment and its modifications 1 to 4 described above, the gate control circuit gives a common gate control signal to the IGBT and the MOSFET. However, in a case where a configuration which will be described below with reference to FIGS. 15 and 16 is adopted, the gate control circuit can give a gate control signal individually to the IGBT and the MOSFET.

Figure 15:
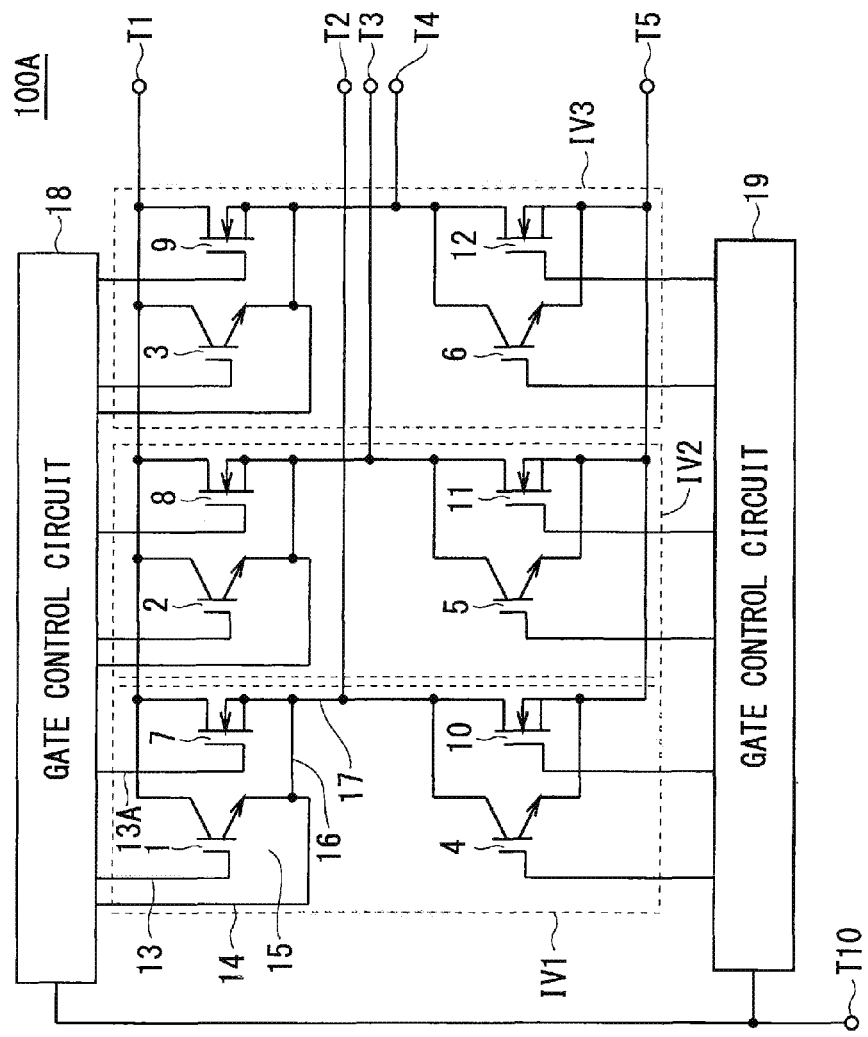
FIG. 15 is a diagram showing a circuit configuration of a three-phase inverter module according to a modification 6 of the preferred embodiment of the present invention.
Figure 16:
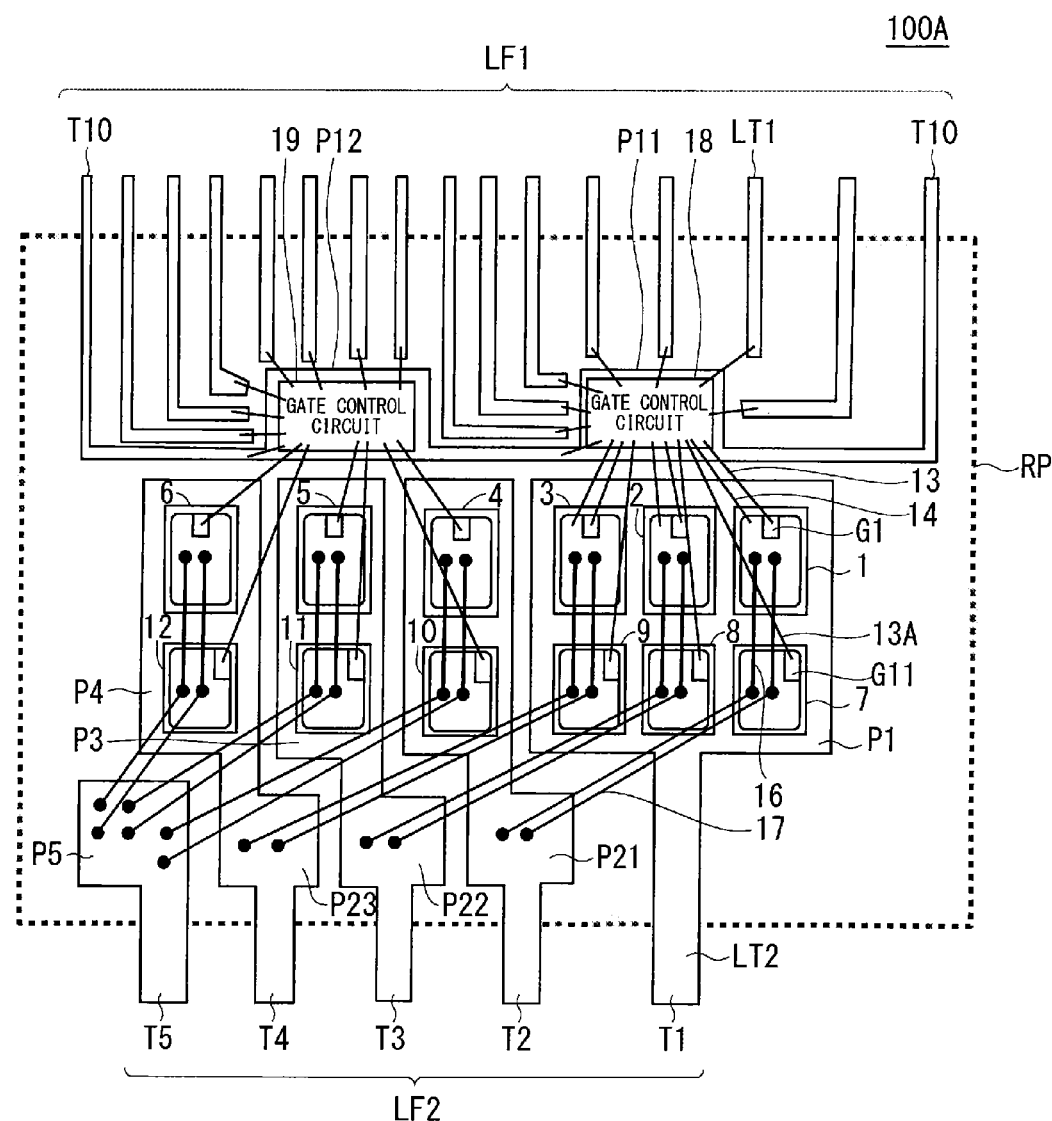
FIG. 16 is a diagram showing an internal configuration of the three-phase inverter module according to the modification 6 of the preferred embodiment of the present invention.

FIG. 15 shows a circuit configuration of a three-phase inverter module 100A to which this modification is applied. The same parts of the configuration as those of the three-phase inverter module 100 shown in FIG. 1 are denoted by the same reference numerals, and redundant descriptions are omitted.

As shown in FIG. 15, in the three-phase inverter module 100A, the gates of the MOSFET 7 and the IGBT 1 are separately connected to the gate control circuit 18, the gates of the MOSFET 8 and the IGBT 2 are separately connected to the gate control circuit 18, and the gates of the MOSFET 9 and the IGBT 3 are separately connected to the gate control circuit 18.

Here, a connection line that connects the gate of each of the IGBTs 1 to 3 to the gate control circuit 18 will be referred to as a line 13, and a connection line that connects the gate of each of the MOSFETs 7 to 9 to the gate control circuit 18 will be referred to as a line 13A.

The gates of the MOSFET 10 and the IGBT 4 are separately connected to the gate control circuit 19. The gates of the MOSFET 11 and the IGBT 5 are separately connected to the gate control circuit 19. The gates of the MOSFET 12 and the IGBT 6 are separately connected to the gate control circuit 19.

FIG. 16 is a diagram showing an internal configuration of the three-phase inverter module 100A. The same parts of the configuration as those of the three-phase inverter module 100 shown in FIG. 2 are denoted by the same reference numerals, and redundant descriptions are omitted.

As shown in FIG. 16, in the three-phase inverter module 100A, gate pads provided in the IGBTs 1 to 6 are only the gate pads G1. The gate pads G1 of the IGBTs 1 to 3 are wire-bonded to the gate control circuit 18. The gate pads G1 of the IGBTs 4 to 6 are wire-bonded to the gate control circuit 19. The gate pads G11 of the MOSFETs 7 to 9 are wire-bonded to the gate control circuit 18. The gate pads G11 of the MOSFETs 10 to 12 are wire-bonded to the gate control circuit 19.

As shown in FIG. 16, the gate pads G1 of the IGBTs 1 to 6 arranged near the gate control circuits 18 and 19 are connected to the gate control circuits 18 and 19 by means of wire bonding, and the gate pads G11 of the MOSFETs 7 to 12 arranged at positions farther from the gate control circuits 18 and 19 are connected to the gate control circuits 18 and 19 by means of wire bonding, too. Accordingly, the gate control circuits gives the gate control signals individually to the IGBT and the MOSFET, to individually adjust the timings of turning on and off the IGBT and the MOSFET. As the timings of turning on and off the IGBT and the MOSFET, the timings described with reference to FIGS. 14 and 15 are applicable.

Thereby, in a transient state at a time of switching, the current flowing in the MOSFET is suppressed. Thus, it is not necessary that the MOSFET has a rating corresponding to a maximum current flow. Therefore, the MOSFET can be downsized, and the whole of the module can be downsized.

<Modification 7>

Although no particular limitation is put on the kind of the MOSFET in the description given above, the MOSFET may be configured as a silicon semiconductor device formed on a silicon (Si) substrate, a silicon carbide semiconductor device formed on a silicon carbide (SiC) substrate, or a gallium nitride semiconductor device formed on a substrate made of a material containing gallium nitride (GaN).

SiC and GaN are wide bandgap semiconductors. A semiconductor device made of a wide bandgap semiconductor has high breakdown voltage characteristics and a high allowable current density, and therefore can be downsized as compared with a silicon semiconductor device. Since the MOSFETs 7 to 12 can further be downsized, the three-phase inverter module 100, 100A can further be downsized.

Needless to say, the IGBT 1 to 4 may be wide bandgap semiconductor devices. Both the IGBTs 1 to 4 and the MOSFETs 7 to 12 may be wide bandgap semiconductor devices.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising, in a modularized manner:

an inverter including first and second switching parts that operate in a complementary manner, said first and second switching parts being interposed in series with each other between a first power supply line that supplies a first voltage and a second power supply line that supplies a second voltage; and first and second control circuits for controlling switching operations of said first and second switching parts, respectively, wherein said first switching part includes a first IGBT and a first MOSFET, one main electrode of each of said first IGBT and said first MOSFET being connected to said first power supply line and the other main electrode of each of said first IGBT and said first MOSFET being connected to an output node of said inverter, said second switching part includes a second IGBT and a second MOSFET, one main electrode of each of said second IGBT and said second MOSFET being connected to said second power supply line and the other main electrode of each of said second IGBT and said second MOSFET being connected to said output node of said inverter, in a plane layout of said power semiconductor device:

said first control circuit is arranged at a position opposed to said first switching part, and one of said first IGBT and said first MOSFET is arranged near said first control circuit while the other of said first IGBT and said first MOSFET is arranged at a position farther from said first control circuit; and said second control circuit is arranged at a position opposed to said second switching part, and one of said second IGBT and said second MOSFET is arranged near said second control circuit while the other of said second IGBT and said second MOSFET is arranged at a position farther from said second control circuit, in said first IGBT and said first MOSFET, a transistor arranged near said first control circuit gives, through a gate thereof, a gate control signal supplied from said first control circuit to a gate of a transistor arranged at the position farther from said first control circuit, in said second IGBT and said second MOSFET, a transistor arranged near said second control circuit gives, through a gate thereof, a gate control signal supplied from said second control circuit to a gate of a transistor arranged at the position farther from said second control circuit.

2. The power semiconductor device according to claim 1, wherein each of said first IGBT and said first MOSFET is a transistor with a vertical structure in which a main current flows perpendicularly to a main surface of a semiconductor substrate, in the transistor within said first switching part which is arranged near said first control circuit, a first gate pad connected to a gate of said transistor is provided at said first control circuit side within a plane of said other main electrode side, and a second gate pad connected to a gate of said transistor is provided at a side opposite to said first control circuit within a plane of said other main electrode side, said gate control signal supplied from said first control circuit is given to said first gate pad, and said gate control signal is outputted from said second gate pad and given to a gate pad of the transistor arranged at the position farther from said first control circuit, each of said second IGBT and said second MOSFET is a transistor with a vertical structure in which a main current flows perpendicularly to a main surface of a semiconductor substrate, in the transistor within said second switching part which is arranged near said second control circuit, a first gate pad connected to a gate of said transistor is provided at said second control circuit side within a plane of said other main electrode side, and a second gate pad connected to a gate of said transistor is provided at a side opposite to said second control circuit within a plane of said other main electrode side, said gate control signal supplied from said second control circuit is given to said first gate pad, and said gate control signal is outputted from said second gate pad and given to a gate pad of the transistor arranged at the position farther from said second control circuit.

3. The power semiconductor device according to claim 2, wherein
in said first switching part, said first IGBT is arranged near said first control circuit,
in said second switching part, said second IGBT is arranged near said second control circuit.

4. The power semiconductor device according to claim 2, wherein
in said first switching part, said first MOSFET is arranged near said first control circuit,
in said second switching part, said second MOSFET is arranged near said second control circuit.

5. The power semiconductor device according to claim 1, wherein
a threshold voltage of said first IGBT is set lower than a threshold voltage of said first MOSFET,
a threshold voltage of said second IGBT is set lower than a threshold voltage of said second MOSFET.

6. The power semiconductor device according to claim 1, wherein
the transistor within said first switching part which is arranged at the position farther from said first control circuit has a resistive element provided between a gate pad and a gate thereof,
the transistor within said second switching part which is arranged at the position farther from said second control circuit has a resistive element provided between a gate pad and a gate thereof.

7. The power semiconductor device according to claim 1, wherein
said first and second MOSFET is either one of a silicon carbide MOSFET formed on a silicon carbide substrate and a gallium nitride MOSFET formed on a substrate made of a material containing gallium nitride.

8. A power semiconductor device comprising, in a modularized manner:
an inverter including first and second switching parts that operate in a complementary manner, said first and second switching parts being interposed in series with each other between a first power supply line that supplies a first voltage and a second power supply line that supplies a second voltage; and
first and second control circuits for controlling switching operations of said first and second switching parts, respectively,
wherein
said first switching part includes a first IGBT and a first MOSFET, one main electrode of each of said first IGBT and said first MOSFET being connected to said first power supply line and the other main electrode of each of said first IGBT and said first MOSFET being connected to an output node of said inverter,
said second switching part includes a second IGBT and a second MOSFET, one main electrode of each of said second IGBT and said second MOSFET being connected to said second power supply line and the other main electrode of each of said second IGBT and said second MOSFET being connected to said output node of said inverter, in a plane layout of said power semiconductor device:
said first control circuit is arranged at a position opposed to said first switching part, and one of said first IGBT and said first MOSFET is arranged near said first control circuit while the other of said first IGBT and said first MOSFET is arranged at a position farther from said first control circuit; and
said second control circuit is arranged at a position opposed to said second switching part, and one of said second IGBT and said second MOSFET is arranged near said second control circuit while the other of said second IGBT and said second MOSFET is arranged at a position farther from said second control circuit,
each of said first IGBT and said first MOSFET is a transistor with a vertical structure in which a main current flows perpendicularly to a main surface of a semiconductor substrate,
in a transistor within said first switching part which is arranged near said first control circuit, a gate pad connected to a gate of said transistor is provided at said first control circuit side within a plane of said other main electrode side, and a relay pattern is provided at a side opposite to said first control circuit within a plane of said other main electrode side,
a first gate control signal supplied from said first control circuit is given to said gate pad while a second gate control signal supplied from said first control circuit is given to said relay pattern, and said second gate control signal is given through said relay pattern to a gate pad of a transistor arranged at the position farther from said first control circuit,
each of said second IGBT and said second MOSFET is a transistor with a vertical structure in which a main current flows perpendicularly to a main surface of a semiconductor substrate,
in a transistor within said second switching part which is arranged near said second control circuit, a gate pad connected to a gate of said transistor is provided at said second control circuit side within a plane of said other main electrode side, and a relay pattern is provided at a side opposite to said second control circuit within a plane of said other main electrode side,
a first gate control signal supplied from said second control circuit is given to said gate pad while a second gate control signal supplied from said second control circuit is given to said relay pattern, and said second gate control signal is given through said relay pattern to a gate pad of a transistor arranged at the position farther from said second control circuit.

9. The power semiconductor device according to claim 8, wherein
said first control circuit gives said first and second gate control signals such that said first IGBT is firstly turned on at a time of turning on and said first MOSFET is firstly turned off at a time of turning off,
said second control circuit gives said first and second gate control signals such that said second IGBT is firstly turned on at a time of turning on and said second MOSFET is firstly turned off at a time of turning off.

10. The power semiconductor device according to claim 8, wherein
said first and second MOSFET is either one of a silicon carbide MOSFET formed on a silicon carbide substrate and a gallium nitride MOSFET formed on a substrate made of a material containing gallium nitride.

11. A power semiconductor device comprising, in a modularized manner:

an inverter including first and second switching parts that operate in a complementary manner, said first and second switching parts being interposed in series with each other between a first power supply line that supplies a first voltage and a second power supply line that supplies a second voltage; and first and second control circuits for controlling switching operations of said first and second switching parts, respectively, wherein said first switching part includes a first IGBT and a first MOSFET, one main electrode of each of said first IGBT and said first MOSFET being connected to said first power supply line and the other main electrode of each of said first IGBT and said first MOSFET being connected to an output node of said inverter, said second switching part includes a second IGBT and a second MOSFET, one main electrode of each of said second IGBT and said second MOSFET being connected to said second power supply line and the other main electrode of each of said second IGBT and said second MOSFET being connected to said output node of said inverter, a gate control signal supplied from said first control circuit is given to a gate of said first IGBT through a first resistive element, said gate control signal supplied from said first control circuit is given to said first MOSFET through a second resistive element, a resistance value of said second resistive element is higher than a resistance value of said first resistive element, and a diode is connected in inverse parallel with said second resistive element, a gate control signal supplied from said second control circuit is given to a gate of said second IGBT through a first resistive element, said gate control signal supplied from said second control circuit is given to said second MOSFET through a second resistive element, a resistance value of said second resistive element is higher than a resistance value of said first resistive element, and a diode is connected in inverse parallel with said second resistive element.

12. The power semiconductor device according to claim 11, wherein said first and second MOSFET is either one of a silicon carbide MOSFET formed on a silicon carbide substrate and a gallium nitride MOSFET formed on a substrate made of a material containing gallium nitride.

13. A power semiconductor device comprising, in a modularized manner:

an inverter including first and second switching parts that operate in a complementary manner, said first and second switching parts being interposed in series with each other between a first power supply line that supplies a first voltage and a second power supply line that supplies a second voltage; and first and second control circuits for controlling switching operations of said first and second switching parts, respectively, wherein said first switching part includes a first IGBT and a first MOSFET, one main electrode of each of said first IGBT and said first MOSFET being connected to said first power supply line and the other main electrode of each of said first IGBT and said first MOSFET being connected to an output node of said inverter, said second switching part includes a second IGBT and a second MOSFET, one main electrode of each of said second IGBT and said second MOSFET being connected to said second power supply line and the other main electrode of each of said second IGBT and said second MOSFET being connected to said output node of said inverter, said first control circuit individually controls switching operations of said first IGBT and said first MOSFET such that said first IGBT is firstly turned on at a time of turning on and said first MOSFET is firstly turned off at a time of turning off, said second control circuit individually controls switching operations of said second IGBT and said second MOSFET such that said second IGBT is firstly turned on at a time of turning on and said second MOSFET is firstly turned off at a time of turning off.

14. The power semiconductor device according to claim 13, wherein said first and second MOSFET is either one of a silicon carbide MOSFET formed on a silicon carbide substrate and a gallium nitride MOSFET formed on a substrate made of a material containing gallium nitride.

\* \* \* \* \*